United States Patent
Yoo et al.

(10) Patent No.: US 9,549,465 B2
(45) Date of Patent: Jan. 17, 2017

(54) PRINTED CIRCUIT BOARD AND METHOD OF MANUFACTURING THE SAME

(71) Applicant: LG INNOTEK CO., LTD., Seoul (KR)

(72) Inventors: Chang Woo Yoo, Seoul (KR); Yeong Uk Seo, Seoul (KR); Byeong Ho Kim, Seoul (KR); Hyun Seok Seo, Seoul (KR); Sang Myung Lee, Seoul (KR); Ki Do Chun, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/365,897

(22) PCT Filed: Dec. 12, 2012

(86) PCT No.: PCT/KR2012/010762
§ 371 (c)(1),
(2) Date: Jun. 16, 2014

(87) PCT Pub. No.: WO2013/089416
PCT Pub. Date: Jun. 20, 2013

(65) Prior Publication Data
US 2014/0332255 A1    Nov. 13, 2014

(30) Foreign Application Priority Data

Dec. 15, 2011    (KR) .................. 10-2011-0135964

(51) Int. Cl.
*H05K 1/11* (2006.01)
*H05K 7/10* (2006.01)
(Continued)

(52) U.S. Cl.
CPC ............ *H05K 1/0298* (2013.01); *H05K 3/465* (2013.01); *H05K 3/06* (2013.01); *H05K 2201/0376* (2013.01); *H05K 2203/0353* (2013.01)

(58) Field of Classification Search
CPC .................. H05K 3/429; H05K 3/4601; H05K 1/11–1/115; H05K 2201/09472; H05K 2201/09481; H05K 2201/095; H05K 2201/09509; H05K 2201/09518; H05K 2201/09527; H05K 2201/09536; H05K 2201/09545; H05K 2201/09563
(Continued)

(56) References Cited

U.S. PATENT DOCUMENTS 6,251,746 B1 *   6/2001  Hong ................ H01L 21/76224
                                           257/E21.546
6,486,039 B2 *  11/2002  Yoo ................... H01L 21/76237
                                           257/E21.548
(Continued)

FOREIGN PATENT DOCUMENTS

JP    2002-184729 A    6/2002
JP    2009-158905 A    7/2009
(Continued)

OTHER PUBLICATIONS

Office Action dated Jun. 26, 2014 in Taiwanese Application No. 101147494.
(Continued)

*Primary Examiner* — Hoa C Nguyen
(74) *Attorney, Agent, or Firm* — Saliwanchik, Lloyd & Eisenschenk

(57) ABSTRACT

Provided are a printed circuit board and a method of manufacturing the same, the printed circuit board according to the present invention, the printed circuit board, including: an insulating substrate having a plurality of circuit pattern grooves formed on a surface thereof; and a plurality of circuit patterns formed by burying the circuit pattern
(Continued)

grooves, wherein the circuit patterns protrude as much as a predetermined thickness from an upper surface of the insulating substrate.

18 Claims, 5 Drawing Sheets

(51) Int. Cl.
*H05K 1/02* (2006.01)
*H05K 3/46* (2006.01)
*H05K 3/06* (2006.01)

(58) Field of Classification Search
USPC ......... 174/260–262, 264, 266; 361/748, 760, 361/777, 803
See application file for complete search history.

(56) References Cited

U.S. PATENT DOCUMENTS

| | | | |
|---|---|---|---|
| 6,607,959 B2* | 8/2003 | Lee | H01L 21/743 257/E21.538 |
| 7,279,393 B2* | 10/2007 | Nanda | H01L 21/82387 257/E21.549 |
| 2002/0061635 A1* | 5/2002 | Lee et al. | 438/584 |
| 2004/0029375 A1* | 2/2004 | Lee | H01L 21/76224 438/626 |
| 2006/0057341 A1* | 3/2006 | Kawabata | C25D 5/022 428/209 |
| 2008/0041621 A1* | 2/2008 | Hsu et al. | 174/262 |
| 2008/0202803 A1* | 8/2008 | Nagase et al. | 174/262 |
| 2009/0155959 A1* | 6/2009 | Lin et al. | 438/124 |
| 2010/0171223 A1* | 7/2010 | Kuo | H01L 21/76898 257/773 |
| 2010/0264549 A1* | 10/2010 | Ko et al. | 257/774 |
| 2011/0139494 A1* | 6/2011 | Yu et al. | 174/255 |
| 2011/0232943 A1* | 9/2011 | Hida | H05K 3/465 174/251 |
| 2012/0138336 A1* | 6/2012 | Watanabe et al. | 174/250 |
| 2013/0032485 A1* | 2/2013 | Muramatsu et al. | 205/125 |

FOREIGN PATENT DOCUMENTS

| | | |
|---|---|---|
| KR | 10-2002-0040091 A | 5/2002 |
| KR | 10-0890447 B1 | 3/2009 |
| KR | 10-2010-0114704 A | 10/2010 |
| KR | 10-2011-0060325 A | 6/2011 |

OTHER PUBLICATIONS

International Search Report in International Application No. PCT/KR2012/010762, filed Dec. 12, 2012.

* cited by examiner

PRINTED CIRCUIT BOARD AND METHOD OF MANUFACTURING THE SAME

CROSS-REFERENCE TO RELATED APPLICATIONS

This application is the U.S. national stage application of International Patent Application No. PCT/KR2012/010762, filed Dec. 12, 2012, which claims priority to Korean Application No. 10-2011-0135964, filed Dec. 15, 2011, the disclosures of each of which are incorporated herein by reference in their entirety.

TECHNICAL FIELD

The present invention relates to a printed circuit board and a method of manufacturing the same.

BACKGROUND ART

A printed circuit board (PCB) is formed by printing a circuit line pattern on an electric insulating substrate with a conductive material such as Cu, and is called a board just before electronic components are mounted. That is, the printed circuit board means a circuit board which is configured such that to closely mount many kinds of electronic devices on a flat board, positions for mounting each component are determined, and a circuit pattern for connecting the components is printed on and is fixed to a surface of the flat board.

Meanwhile, to cope with the recent trend of high performance and small-sized electronic components, a buried pattern capable of making a surface of the board even at the same time as reducing a thickness of the printed circuit board has been used.

FIG. 1 illustrates a general buried-type printed circuit board.

As shown in FIG. 1, a buried-type printed circuit board 10 is configured such that a buried pattern groove 2 is formed on a surface of an insulating substrate 1, and a circuit pattern 3 is formed by burying the buried pattern groove 2 using plating.

In the printed circuit board 10 on which the circuit pattern 3 is formed, due to a formation structure of the base circuit pattern and the contact part, a bonding force with the insulating member becomes very high, and pitches of the base circuit pattern and the contact part are uniformly and minutely formed.

However, in the case of forming the buried circuit pattern 3 using plating, a deviation in plating between an area in which the pattern groove 2 is formed, and a remaining area is generated. Thus, upon etching after plating, the etching is not uniformly performed. Accordingly, like FIG. 1, since the etching is not performed at one area of the circuit pattern 3, a short between the adjacent circuit patterns occurs, and since the etching is excessively performed at another area, an error in signal transmission occurs.

DISCLOSURE OF INVENTION

Technical Problem

An aspect of the present invention provides a printed circuit board having a buried circuit pattern.

An aspect of the present invention also provides a new method of manufacturing a buried circuit pattern.

Solution to Problem

According to an aspect of the present invention, there is provided a printed circuit board including: an insulating substrate having a plurality of circuit pattern grooves formed on its surface; and a plurality of circuit patterns formed by burying the circuit pattern grooves, wherein the circuit patterns protrude as much as a predetermined thickness from an upper surface of the insulating substrate.

According to an aspect of the present invention, there is also provided a method of manufacturing a printed circuit board, including: forming a base circuit pattern on an insulating plate; forming an insulating layer on the insulating plate so as to cover the base circuit pattern; plating a surface of the insulating layer with a first metal layer forming a plated layer in which a circuit pattern groove is buried by plating the first metal layer of the circuit pattern groove as a seed layer; forming a buried pattern by removing the plated layer until the insulating layer is exposed through a physical and chemical etching process; and removing an upper surface of the insulating layer up to a predetermined depth.

According to an aspect of the present invention, there is also provided a printed circuit board, including an insulating substrate having a plurality of circuit pattern grooves formed on its surface; and a plurality of circuit patterns formed by burying the circuit pattern grooves, wherein the circuit patterns are formed to be depressed as much as a predetermined thickness from an upper surface of the insulating substrate.

Advantageous Effects of Invention

According to the present invention, since the circuit patterns are formed by burying the grooves of the board using plating, and the plated layer of the upper part of the insulating layer is removed by using a chemical and physical etching process, the buried pattern can be simply and minutely formed.

Also, since the chemical and physical etching process is used, the etching process can be carried out until the insulating layer is exposed without any short generated between adjacent circuit patterns.

Also, since the upper surface of the insulating layer is removed after the buried circuit patterns are formed, metal components which remain on the insulating layer can be removed, thereby preventing an electrical short from being generated.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

MODE FOR THE INVENTION

Hereinafter, preferred embodiments of the present invention will be described in detail with reference to the accompanying drawings in such a manner that the present could be easily implemented by those having ordinary skill in the art to which the present invent pertains. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

To clearly explain the present invention, the parts which have no relation with the explanation are omitted, and to clearly express various layers and areas, their thicknesses are enlarged. Also, like numbers may refer to like elements throughout the description of the figures.

When it is mentioned that a part such as a layer, a film, an area, a plate and the like is "above" other part, this includes a case in which the part is just above the other part as well as a case in which still another part is in their middle. On the contrary, when it is mentioned that a part is just above other part, this means that there is no still another part in their middle.

With respect to a printed circuit board in which circuit patterns are formed in a buried type, the present invention provides a method capable of preventing a short between the adjacent circuit patterns from being generated by uniformly forming the circuit patterns through grinding.

Hereinafter, a printed circuit board according to one exemplary embodiment of the present invention will be explained with reference to FIG. 2 through FIG. 10.

Figure 1:
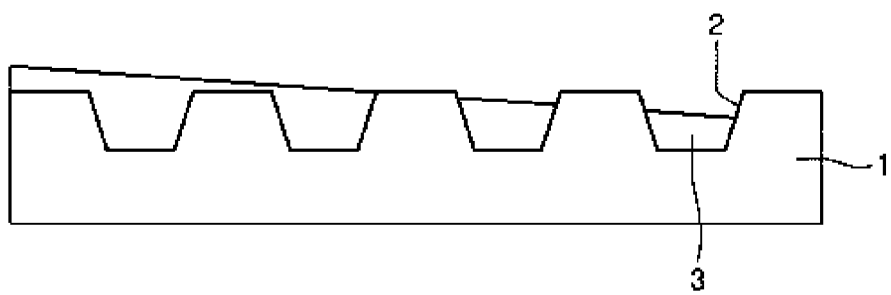
FIG. 1 is a cross-sectional view of a printed circuit board according to a conventional art.
Figure 2:
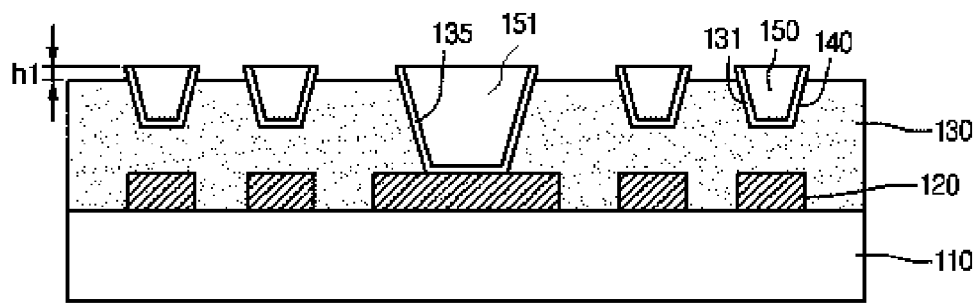
FIG. 2 is a cross-sectional view of a printed circuit board according to one exemplary embodiment of the present invention.

FIG. 2 is a cross-sectional view of a printed circuit board according to one exemplary embodiment of the present invention.

Referring to FIG. 2, a printed circuit board 100 according to the present invention includes: an insulating plate 110 a first circuit pattern 120 formed on the insulating plate 110; an insulating layer 130; and a plurality of second circuit patterns 150.

The insulating plate 110 may be a thermosetting or a thermoplastic polymer substrate, a ceramic substrate, an organic-inorganic composite material substrate, or a glass fiber-impregnated substrate. When the insulating plate 110 includes a polymer resin, it may include an epoxy insulating resin. Unlike this, the insulating plate 110 may also include a polyimide-based resin.

As a base circuit pattern, the plurality of first circuit patterns 120 may be formed on the insulating plate 110.

The first circuit pattern 120 may be formed of a material having a high electric conductivity and low resistance, and may be also formed by patterning a copper foil laminate, which is a thin copper layer, as a conductive layer. When the first circuit pattern 120 is the copper foil laminate, and the insulating plate 110 includes resins, the first circuit pattern 120 and the insulating plate 110 may be a normal copper clad laminate (CCL).

Meanwhile, on the insulating plate 110, the first circuit pattern is buried and the insulating layer 130 is formed.

The insulating layer 130 may be formed in the plurality of insulating layers 130, and each insulating layer 130 may be a polymer resin and the like.

The insulating layer 130 includes: via holes 135 to which the first circuit pattern is exposed; and a circuit pattern groove 131 for forming a plurality of second circuit patterns 150.

At this time, the circuit pattern groove 131 is formed so that a cross section thereof has a slant. Preferably, the cross-section is formed so that a width becomes narrow gradually toward the bottom.

The pattern of the circuit pattern groove 131 may range from 3 to 25 μm in width and 3 to 25 μm in depth. Furthermore, an intaglio of the via holes 135 may satisfy about less than 80 μm in diameter, and may satisfy about less than 100 μm in depth.

A metal layer 140 is formed along a shape of the circuit pattern groove 131 in an inner part of the circuit pattern groove 131 and the plurality of via holes 135 of the insulating layer 130.

The metal layer 140 is a seed layer. The metal layer may be formed of Cu, Ni or an alloy thereof.

The second circuit patterns 150 and a via 151 in which the circuit pattern groove 131 and the via holes 135 are buried, respectively are formed on the metal layer 140.

The second circuit patterns 150 and the via 151 may be simultaneously formed and may be also formed of an alloy including at least one of Al, Cu, Ag, Pt, Ni or Pd, and by plating the metal layer 140 as the seed layer.

At this time, the second circuit patterns 150 and the via 151 are formed to protrude as much as a first height h1 from the upper surface of the insulating layer 130 while burying the circuit pattern groove 131 and the via holes 135.

The first height h1 may satisfy ¹⁄₁₀ to ⅕ of a depth of the circuit pattern groove 131, but the prevent invention is not limited to this.

Hereinafter, a method of manufacturing the printed circuit board 100 of FIG. 2 will be explained with reference to FIG. 3 through FIG. 9.

Figure 3:
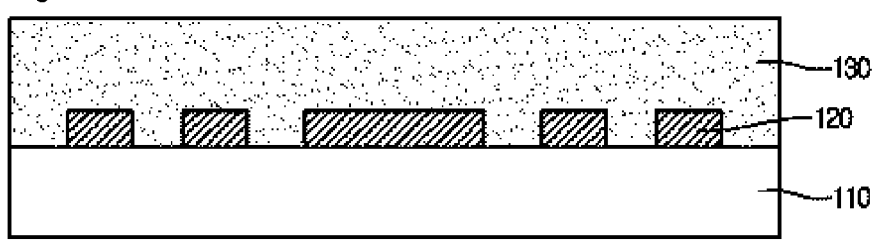
FIG. 3 through FIG. 10 are cross-sectional views showing one method of manufacturing the printed circuit board of FIG. 2.

First, like FIG. 3, the first circuit pattern 120 is formed on the insulating plate 110.

The configurations of the insulating plate 110 and the first circuit pattern 120 may be formed by etching the copper foil laminate CCL according to a design of the first circuit pattern 120. Unlike this, they may be also formed by laminating the copper foil laminate on a ceramic substrate and thereafter etching the copper foil laminate.

At this time, the first circuit pattern 120 may also include patterns connected to the second circuit patterns 150 through the via holes 135 as shown in FIG. 2.

Next, an insulating substrate is prepared by forming the insulating layer 130 on the insulating plate 110 so as to cover the first circuit pattern 120.

The insulating layer 130 may be formed by applying a thermosetting resin and a half-hardened resin, which is not completely hardened, onto the insulating plate 110 in a predetermined thickness, and hardening it by applying heat and pressure thereto. Furthermore, the insulating layer 130 may be also formed as a plurality of layers.

Figure 4:
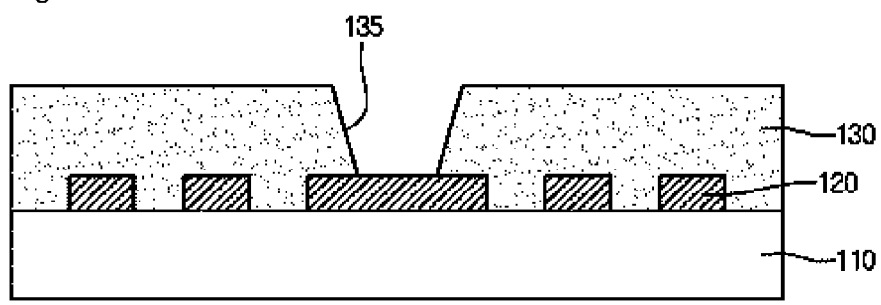

Next, like FIG. 4, the via holes 135 to which the first circuit pattern 120 is exposed are formed in the insulating layer 130. The via holes 135 may be formed to have a side surface which is inclined at a predetermined angle to a plane of the substrate as shown in FIG. 4. Unlike this, the via holes 135 may be also formed to have a side surface which is vertical to the plane of the substrate.

The via holes 135 may be formed using a laser. At this time, the laser may use an UV laser or a $CO_2$ laser.

Also, the via holes 135 may be formed by a physical method, namely, a drill process, or may be also formed by selectively etching them with a chemical method.

Figure 5:
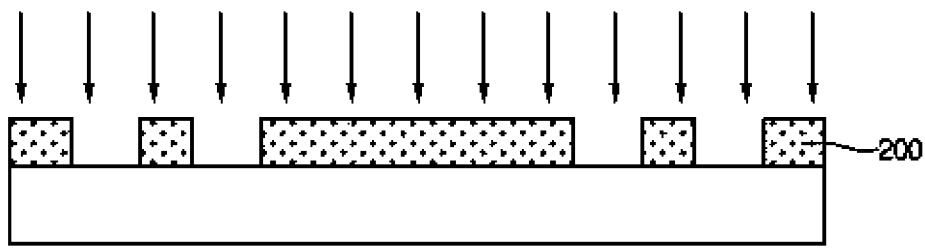
Figure 5:
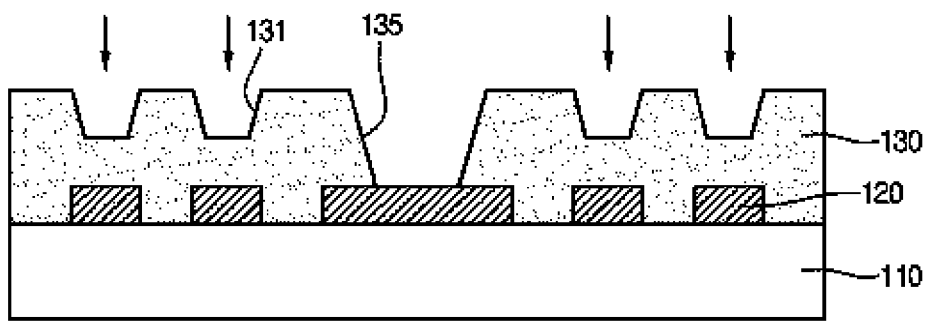

Next, as shown in FIG. 5, the circuit pattern groove 131 for forming the second circuit patterns 150 is formed in the insulating layer 130. In the case of FIG. 5, the circuit pattern groove 131 may be formed using an excimer laser for emitting a laser beam having a wavelength of an ultraviolet area. A KrF excimer laser (i.e. krypton fluoride laser, center wavelength of 248 nm), or an ArF excimer laser (i.e. argon fluoride laser, center wavelength of 193 nm) and the like may be applied to the excimer laser.

In the case where the circuit pattern groove 131 is formed using the excimer laser, the circuit pattern groove 131 may be formed by forming a pattern mask 200 for simultaneously forming the circuit pattern groove 131 and selectively irradiating the excimer laser through the pattern mask 200.

As shown in FIG. 5, in the case where the circuit pattern groove 131 is formed through the pattern mask 200 using the excimer laser, a cross-section of the circuit pattern groove 131 is formed to have an edge in a trapezoidal shape or a rectangular shape as shown in FIG. 5.

At this time, a region in which the via holes 135 are formed forms a groove having a larger area than the exposed upper surface of the via holes 135 so that the via holes 135 may have a layered structure.

In the case where the via holes 135 are formed in the layered structure, the extended upper surface of the via holes 135 may be used as a pad for mounting a device so that an area for mounting the device may be secured.

Next, a smear of the surface of the insulating layer 130 is removed by performing a desmear process.

That is, after the insulating layer 130 is inflated, the inflated insulating layer 130 is removed using permanganate, and the smear is removed through a wet process for neutralizing the surface of the insulating layer 130.

Roughness may be provided on the surface of the insulating layer 130 through the desmear process.

Figure 6:
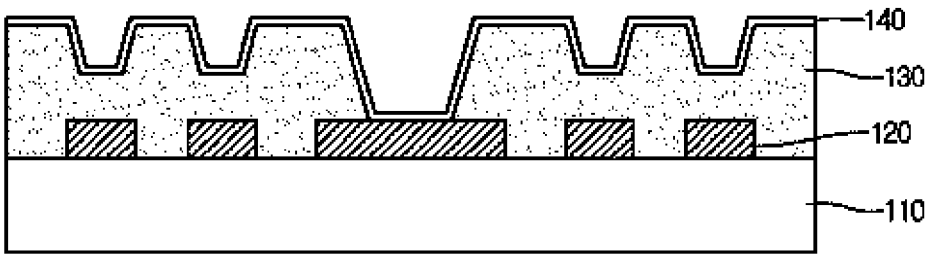

Next, as shown in FIG. 6, the metal layer 140 is formed on the insulating layer 130.

The metal layer 140 may be formed by an electroless plating method.

The electroless plating method may be conducted in order of a degreasing process, a soft corrosion process, a spare catalyst treatment process, a catalyst treatment process, an activating process, an electroless plating process and a treatment process for preventing oxidation. Also, the metal layer 140 may be formed by sputtering metal particles using plasma.

The metal layer 140 is formed of an alloy including Cu, Ni, Pd or Cr.

Figure 7:
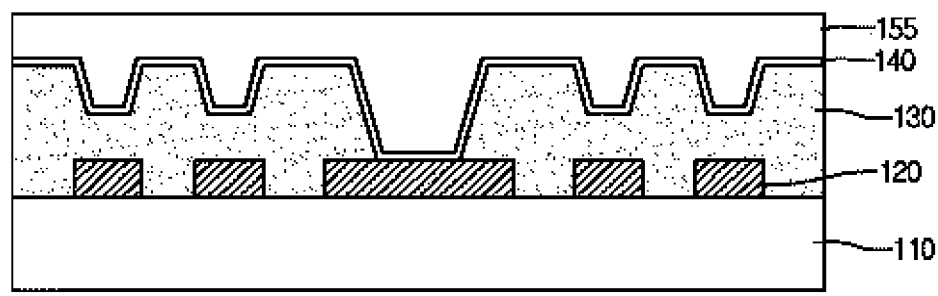

Next, as shown in FIG. 7, a plated layer 155 is formed by electrolytic plating the metal layer 140 as a seed layer with a conductive material.

The plated layer 155 may be formed by electrolytic plating the metal layer 140 as the seed layer. The plating may be performed at the same time as controlling currents depending on a plating area.

The plated layer 155 may be formed of Cu having a high conductivity.

Figure 8:
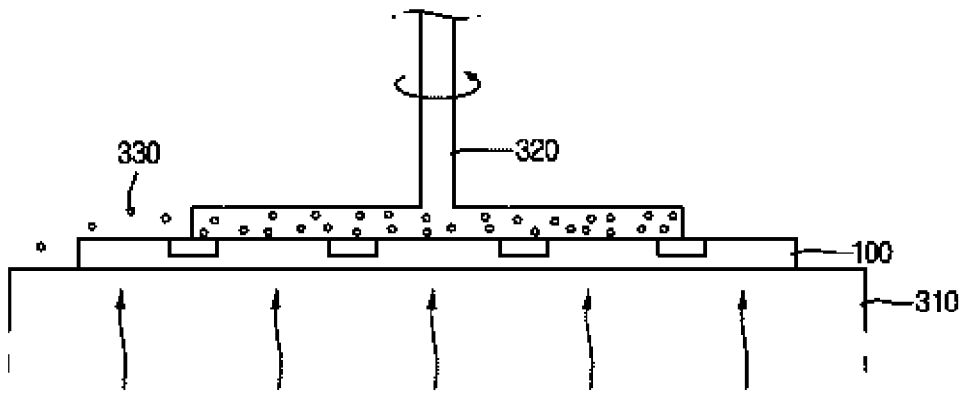

Next, as shown in FIG. 8, to remove the plated layer 155 from the insulating layer 130, a chemical and physical grinding process is performed.

That is, referring to FIG. 8, the printed circuit board 100 is disposed on a plate 310, and the plated layer 155 which is excessively plated is ground using a slurry, preferably in which ammonia is contained as a main component and into which a small amount of hydrogen peroxide is added, at an alkali atmosphere of more than pH 9.

A grinder 320 rotates on the plate 310 and induces the physical etching of the slurry and the plated layer which is excessively plated.

Figure 9:
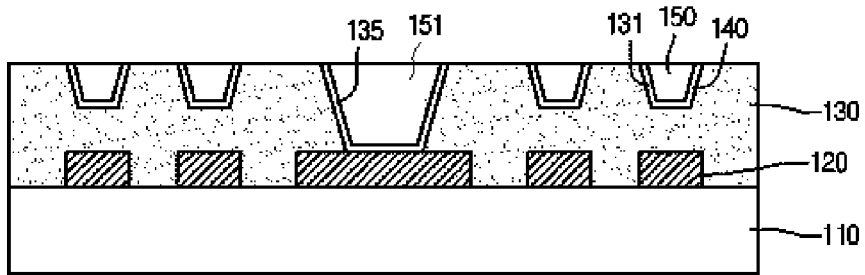

Accordingly, like FIG. 9, by the chemical and physical etching process, the metal layer 155 is etched until the insulating layer 130 is exposed. The grinding is completed without the plated layer 155 which remains on the insulating layer 130.

The plate 310 may have a diameter of less than 1300 mm, and may have a heating wire which is formed so that heat is transmitted to the printed circuit board 100. Accordingly, the printed circuit board 100 having a size of more than 510 nm and 410 mm in length and breadth may be simultaneously etched, so a process for removing the plated layer 155 having a large area may be performed.

Figure 10:
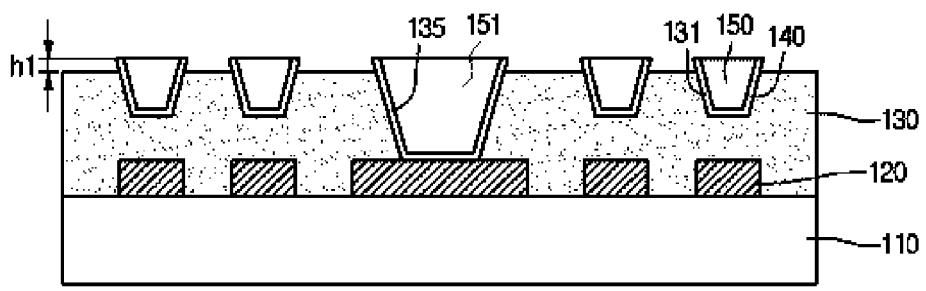

Next, after the insulating layer 130 exposed to the surface as shown in FIG. 10 is inflated, the inflated insulating layer 130 is removed using permanganate, and the insulating layer is removed as much as a first height h1 through a wet process for neutralizing the surface of the insulating layer 130.

Accordingly, the second circuit patterns 150 and the via 151 may protrude as much as the first height from the upper surface of the insulating layer 130.

Thanks to this process, metal particles which may cause a electrical short between the adjacent circuit patterns 150 by penetrating the surface of the insulating layer 130 may be removed.

Hereinafter, a printed circuit board according to other exemplary embodiment of the present invention will be explained with reference to FIG. 11 through FIG. 19.

Figure 11:
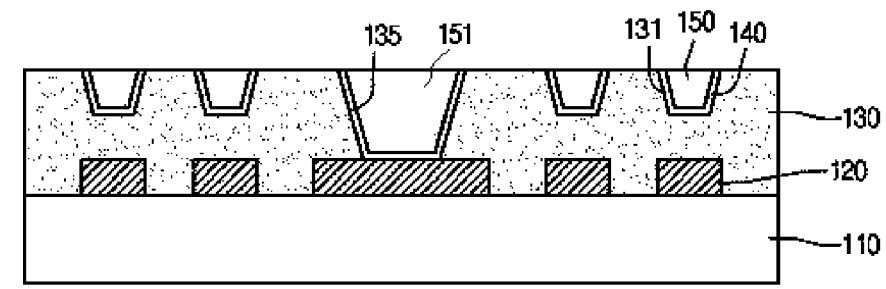

Referring to FIG. 11, a printed circuit board 100A includes: the insulating plate 110; the first circuit pattern 120 formed on the insulating plate 110; the insulating layer 130; and the plurality of second circuit patterns 150.

The respective shapes of the insulating plate 110, the first circuit pattern 120, and the insulating layer 130 are the same as those of the printed circuit board of FIG, and thus the explanation thereon is omitted.

The metal layer 140 is formed along a shape of the circuit pattern groove 131 in the inner part of the circuit pattern groove 131 and the plurality of via holes 135 of the insulating layer 130. The second circuit patterns 150 and the via 151 for burying the circuit pattern groove 131 and the via holes 135, respectively, are formed on the metal layer 140.

The second circuit patterns 150 and the via 151 may be simultaneously formed, and may be formed of an alloy including at least one of Al, Cu, Ag, Pt, Ni or Pd, and by plating the metal layer 140 as the seed layer.

Unlike FIG. 2, the second circuit patterns 150 and the via 151 are configured such that each upper surface thereof is formed so as to have the same height as the insulating layer 130 and so as not to protrude over the upper surface of the insulating layer 130.

Hereinafter, a method of manufacturing the printed circuit board 100 of FIG. 11 will be explained with reference to FIG. 12 through FIG. 19.

Figure 12:
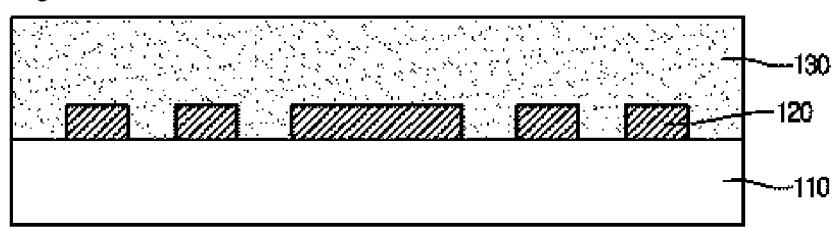
FIG. 12 through FIG. 19 are cross-sectional views showing another method of manufacturing the printed circuit board.

First, like FIG. 12, the first circuit pattern 120 is formed on the insulating plate 110.

The configurations of the insulating plate 110 and the first circuit pattern 120 may be formed by etching the copper foil laminate CCL according to a design of the first circuit pattern 120. Unlike this, they may be also formed by laminating the copper foil laminate on a ceramic substrate and thereafter etching the copper foil laminate.

At this time, the first circuit pattern 120 may also include the patterns connected to the second circuit patterns 150 through the via holes 135 as shown in FIG. 11.

Next, an insulating substrate is prepared by forming the insulating layer 130 on the insulating plate 110 so as to cover the first circuit pattern 120.

The insulating layer 130 may be formed by applying a thermosetting resin and a half-hardened resin, which is not completely hardened, onto the insulating plate 110 in a predetermined thickness, and hardening it by applying heat and pressure thereto. Furthermore, the insulating layer 130 may be also formed as a plurality of layers.

Figure 13:
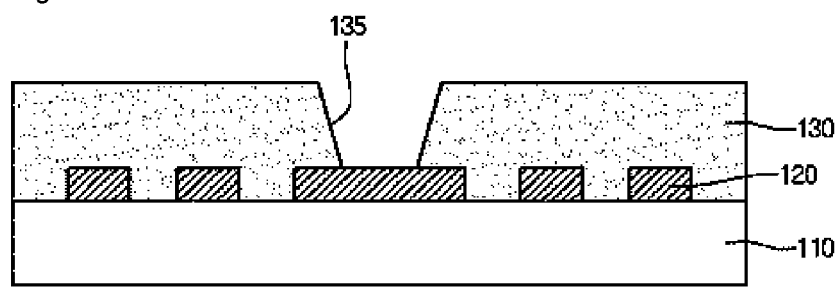

Next, like FIG. 13, the via holes 135 to which the first circuit pattern 120 is exposed are formed in the insulating layer 130. The via holes 135 may be formed using a laser. At this time, the laser may use an UV laser or a $CO_2$ laser.

Also, the via holes 135 may be formed by a physical method, namely, a drill process, or may be also formed by selectively etching them with a chemical method.

Figure 14:
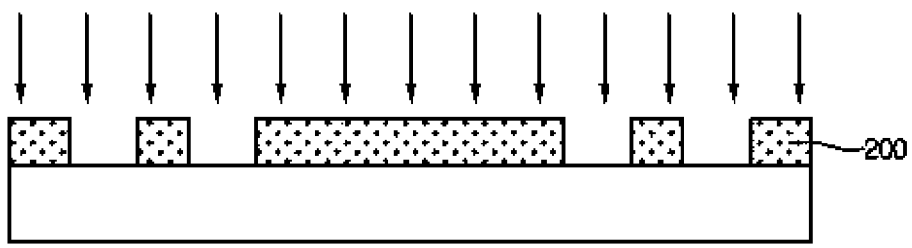
Figure 14:
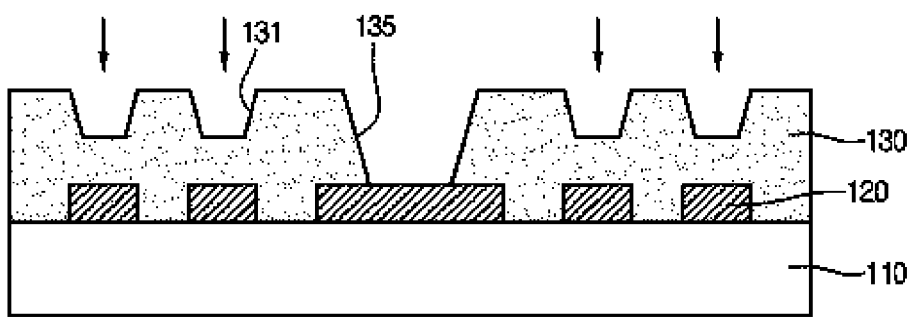

Next, as shown in FIG. 14, the circuit pattern groove 131 for forming the second circuit patterns 150 is formed in the insulating layer 130.

In the the case where the circuit pattern groove 131 is formed through the pattern mask 200 using the excimer laser, a cross-section of the circuit pattern groove 131 is formed to have an edge in a trapezoidal shape or a rectangular shape as shown in FIG. 14.

At this time, a region in which the via holes 135 are formed forms a groove having a larger area than an exposed upper surface of the via holes 135 so that the via holes 135 may have a layered structure.

In the case where the via holes 135 are formed in the layered structure, the extended upper surface of the via holes 135 may be used as a pad for mounting a device so that an area for mounting the device may be secured.

Next, a smear of the surface of the insulating layer 130 is removed by performing a desmear process.

That is, after the insulating layer 130 is inflated, the inflated insulating layer 130 is removed using permanganate, and the smear is removed through a wet process for neutralizing the surface of the insulating layer 130.

Roughness may be provided on the surface of the insulating layer 130 through the desmear process.

Figure 15:
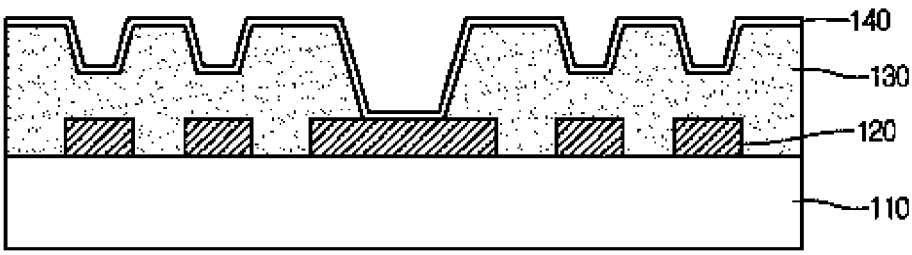

Next, as shown in FIG. 15, the metal layer 140 is formed on the insulating layer 130.

The metal layer 140 may be formed by an electroless plating method.

The electroless plating method may be conducted in order of a degreasing process, a soft corrosion process, a spare catalyst treatment process, a catalyst treatment process, a activating process, an electroless plating process and a treatment process for preventing oxidation. Also, the metal layer 140 may be formed by sputtering metal particles using plasma.

The metal layer 140 is formed of an alloy including Cu, Ni, Pd or Cr

Figure 16:
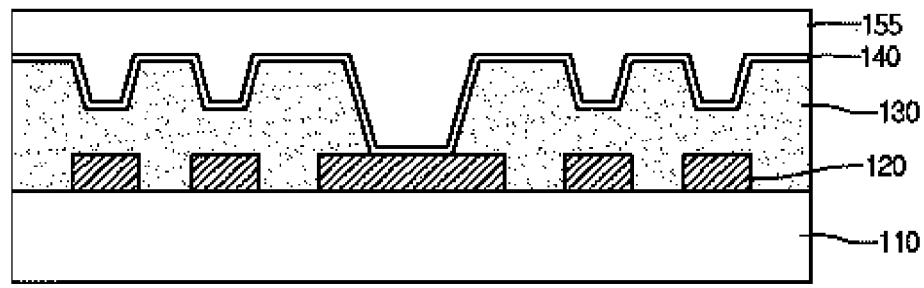

Next, as shown in FIG. 16, the plated layer 155 is formed by electrolytic plating the metal layer 140 as a seed layer with a conductive material.

The plated layer 155 may be formed by electrolytic plating the metal layer 140 as the seed layer. The plating at the same time as controlling currents depending on a plating area may be performed.

The plated layer 155 may be formed of Cu having a high conductivity.

Figure 17:
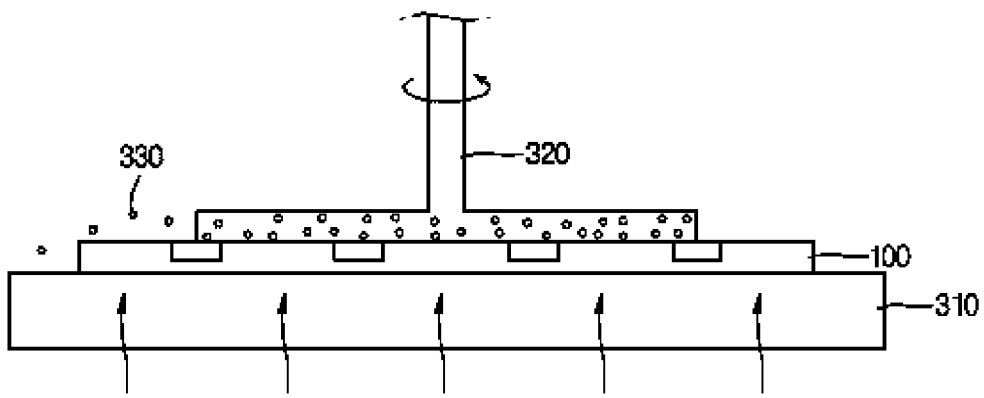

Next, as shown in FIG. 17, to remove the plated layer 155 from the insulating layer 130, a chemical and physical etching process is performed.

That is, referring to FIG. 17, the printed circuit board 100 is disposed on the plate 310, and the plated layer 155 which is excessively plated is ground using a slurry, preferably in which ammonia is contained as a main component and into which a small amount of hydrogen peroxide is added, at an alkali atmosphere of more than pH 9.

The grinder 320 rotates on the plate 310 and induces the physical etching of the slurry and the plated layer which is excessively plated.

Figure 18:
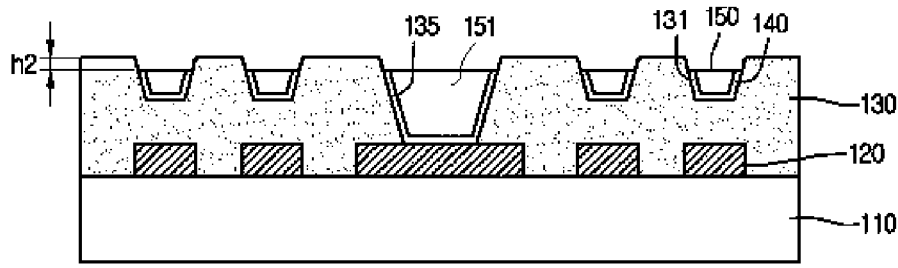

At this time, as shown in FIG. 18, after the insulating layer is exposed by the chemical and physical grinding process, the plated layer 155 is etched until the second circuit patterns 150 are etched as much as the second depth h2 from the upper surface of the insulating layer 130.

The plate 310 may have a diameter of less than 1300 mm, and may have heat rays which are formed so that heat is transmitted to the printed circuit board 100. Accordingly, the printed circuit board 100 having a size of more than 510 mm and 410 mm in length and breadth may be simultaneously etched, so a process for removing the plated layer 155 having a large area may be performed.

Figure 19:
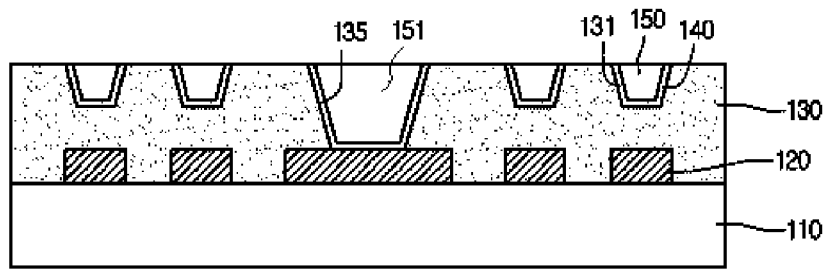

Next, after the insulating layer 130 exposed to the surface as shown in FIG. 19 is inflated, the inflated insulating layer 130 is removed using permanganate, and the upper surface of the insulating layer is formed to be coincident with the upper surface of the second circuit patterns 150 through a wet process for neutralizing the surface of the insulating layer 130.

Thanks to this process, metal particles which may cause an electrical short between the adjacent circuit patterns 150 by penetrating the surface of the insulating layer 130 may be removed.

Figure 20:
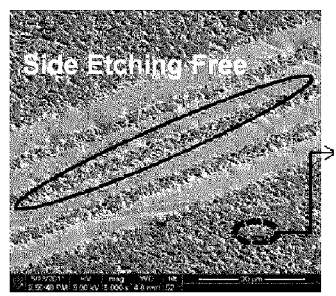
FIG. 20 is a photo and a graph showing each effect according to of the present invention.
Figure 20:
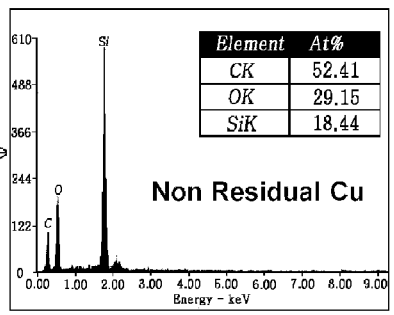
Figure 20:
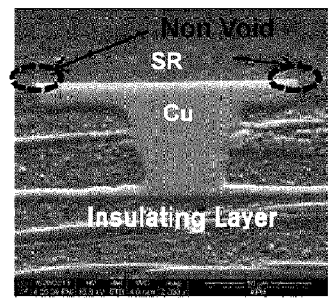

As shown in FIG. 20a, since the insulating layer is etched, a copper component is not detected on the upper surface of the insulating layer as shown FIG. 2b. Furthermore, as shown in FIG. 20c, due to the separation of the copper component, a void is not generated, so an exciting phenomenon of the circuit patterns is not observed.

Hereinafter, a printed circuit board according to still another exemplary embodiment of the present invention will be explained with reference to FIG. 21.

Figure 21:
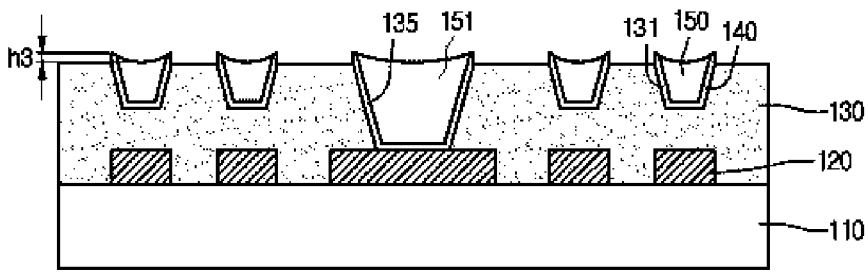
FIG. 21 is a cross-sectional view of the printed circuit board according to another exemplary embodiment of the present invention.

Referring to FIG. 21, a printed circuit board 100B includes: the insulating plate 110 the first circuit pattern 120 formed on the insulating plate 110; the insulating layer 130; and the plurality of second circuit patterns 150.

The respective shapes of the insulating plate 110, the first circuit pattern 120 and the insulating layer 130 are identical with those on the printed circuit board of FIG. 2. Thus, the explanation thereon will be omitted.

The metal layer 140 is formed along the shape of the circuit pattern groove 131 in the inner part of the circuit pattern groove 131 and the plurality of via holes 135 of the insulating layer 130. The second circuit patterns 150 and the via 151 for burying the circuit pattern groove 131 and the via holes 135, respectively, are formed on the metal layer 140.

The second circuit patterns 150 and the via 151 may be simultaneously formed and may be formed of an alloy including at least one of Al, Cu, Ag, Pt, Ni or Pd, and by plating the metal layer 140 as the seed layer.

The second circuit patterns 150 and the via 151 do not protrude over the upper surface of the insulating layer 130. However, the second circuit patterns 150 and the via 151 may have each cross-section in concave shape so that each height of the second circuit patterns 150 and the via 151 becomes low gradually toward a center area.

The center area may be depressed as much as a third depth h3 to an edge area. The third depth h3 may satisfy $1/10$ to $1/5$ of the circuit pattern groove 131.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A printed circuit board, comprising:
   an insulating plate;
   first circuit patterns patterned on the insulating plate;
   an insulating layer covering the first circuit patterns;
   circuit pattern grooves formed on a surface of the insulating layer; and
   second circuit patterns formed to bury the circuit pattern grooves and having an exposed surface protruding from an upper surface of the insulating layer,
   wherein each of the second circuit patterns comprises:
   a first part burying a circuit pattern groove of the circuit pattern grooves, and
   a second part on the first part and protruded from the upper surface of the insulating layer,
   wherein a bottom surface of each first part of the second circuit patterns is higher than a bottom surface of the insulating layer,
   wherein an exposed surface of each second part of the second circuit patterns has a concave shape,
   wherein widths of the first part are gradually increased from a bottom portion of the first part to a top portion of the first part, and
   wherein a width of a bottom portion of the second part equals a width of a top portion of the second part.

2. The printed circuit board of claim 1, wherein a central area of each second part of the second circuit patterns is more depressed than an edge area.

3. The printed circuit board of claim 1, wherein a wall surface of the circuit pattern grooves is inclined with respect to a plane surface of the insulating plate.

4. The printed circuit board of claim 1, wherein each second part of the second circuit patterns protrudes to a depth corresponding to $1/10$ to $1/5$ of a depth of the corresponding circuit pattern groove.

5. The printed circuit board of claim 1, further comprising a metal layer formed on surfaces of the circuit pattern grooves.

6. The printed circuit board of claim 5, wherein the second circuit patterns are formed on the metal layer.

7. The printed circuit board of claim 5, wherein the metal layer contains at least one material of Cu, Ni, Pd and Cr.

8. The printed circuit board of claim 1, further comprising via holes that expose the first circuit patterns.

9. The printed circuit board of claim 8, further comprising vias that bury the via holes.

10. The printed circuit board of claim 9, wherein the vias have an exposed surface in a concave shape.

11. The printed circuit board of claim 9, wherein a central area of the vias is more depressed than an edge area.

12. The printed circuit board of claim 9, wherein the exposed surface of the vias is wider than a bottom surface.

13. The printed circuit board of claim 9, wherein a wall surface of the vias is inclined with respect to a plane surface of the insulating plate.

14. The printed circuit board of claim 9, wherein the vias protrude to a depth corresponding to $1/10$ to $1/5$ of a depth of the circuit pattern grooves.

15. The printed circuit board of claim 9, wherein the second circuit patterns and the vias contain at least one material of Al, Cu, Ag, Pt, Ni and Pd.

16. The printed circuit board of claim 1, wherein the insulating plate is any one of a thermosetting or a thermoplastic polymer substrate, a ceramic substrate, an organic-inorganic composite material substrate, a glass fiber-impregnated substrate, an epoxy-based insulating resin substrate and a polyimide-based resin substrate.

17. The printed circuit board of claim 1, wherein the first circuit patterns are a copper foil layer.

18. The printed circuit board of claim 1, wherein the insulating plate and the first circuit patterns form a copper clad laminate (CCL).

* * * * *